United States Patent
Penney (10) Patent No.: US 10,482,936 B2
(45) Date of Patent: *Nov. 19, 2019

(54) SIGNAL TRAINING FOR PREVENTION OF METASTABILITY DUE TO CLOCKING INDETERMINACY

(71) Applicant: Micron Technology, Inc., Boise, ID (US)

(72) Inventor: Daniel B. Penney, Wylie, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/423,852

(22) Filed: May 28, 2019

(65) Prior Publication Data
US 2019/0279694 A1    Sep. 12, 2019

Related U.S. Application Data

(63) Continuation of application No. 15/826,404, filed on Nov. 29, 2017, now Pat. No. 10,332,575.

(51) Int. Cl.
*G11C 7/00* (2006.01)
*G11C 7/22* (2006.01)
*G11C 7/10* (2006.01)

(52) U.S. Cl.
CPC ............ *G11C 7/222* (2013.01); *G11C 7/1066* (2013.01); *G11C 7/1093* (2013.01); *G11C 7/1096* (2013.01)

(58) Field of Classification Search
CPC ....... G11C 7/222; G11C 7/1066; G11C 7/1096; G11C 7/1093
See application file for complete search history.

(56) References Cited

U.S. PATENT DOCUMENTS

| | | | |
|---|---|---|---|
| 6,317,369 B1 | 11/2001 | Kubo et al. | |
| 6,337,832 B1 | 1/2002 | Ooishi et al. | |
| 7,009,911 B2* | 3/2006 | Morzano | G11C 8/10 365/200 |
| 2013/0265826 A1* | 10/2013 | Lee | G11C 16/10 365/185.17 |
| 2014/0189224 A1 | 7/2014 | Kostinsky et al. | |
| 2016/0133309 A1 | 5/2016 | Maryan et al. | |
| 2018/0275714 A1 | 9/2018 | Chang et al. | |

* cited by examiner

*Primary Examiner* — Mohammed A Bashar
(74) *Attorney, Agent, or Firm* — Fletcher Yoder, P.C.

(57) ABSTRACT

Methods and systems that may employ adjustments to the latencies in the input circuitry to reduce the latency during initialization period and to prevent undesired effects from metastability are provided. Disclosed systems may employ adjustable delays during a signal training process to cause adjustments in the timing of the host that will reduce latencies during write cycles. Certain systems may further reduce latencies by employing input logic circuitry that produces a valid, consistent signal from the bidirectional connection, such as a gate, and preventing metastability in input circuitry altogether. Such circuitry allows bypassing of initialization periods to stabilize the input, and allows further reduction of the initialization.

22 Claims, 7 Drawing Sheets

SIGNAL TRAINING FOR PREVENTION OF METASTABILITY DUE TO CLOCKING INDETERMINACY

CROSS REFERENCE TO RELATED APPLICATIONS

This application is a Continuation and claims priority to U.S. patent application Ser. No. 15/826,404, filed Nov. 29, 2017, which is herein incorporated by reference.

BACKGROUND

1. Field of the Invention

The present disclosure relates to memory devices, and more specifically, to methods that mitigate metastability effects in input circuitry employing delay elements and signal training methods.

2. Description of the Related Art

Random access memory (RAM) devices, such as the ones used in electronic devices to facilitate data processing and/or provide storage, may provide direct access to addressable data storage cells that form the memory circuitry of the device. Certain RAM devices, such as dynamic RAM (DRAM) devices may, for example, have multiple memory banks having many addressable memory elements. The RAM devices may also have a command interface that may receive addresses and instructions for operations, such as read or write, which may be associated with those addresses. The RAM devices may also include decoding circuitry that may translate the instructions and the addresses into internal commands for accessing the corresponding memory banks.

The data exchanged between the processing circuitry (e.g., host) of an electronic device and the memory device may be accompanied by synchronizing clock signals. As an example, during a write process, the electronic device may provide data strobing signals, which may be synchronized with the data to be stored, allowing the RAM devices to capture the incoming data at the proper moment. During a read process, the memory device may provide data strobing signals synchronized with retrieved stored data to facilitate latching of the outgoing data in the host. In some systems, the strobe clock signals may travel in a bidirectional electrical connection between the host and the memory device, and the direction may depend on the specific command being executed. As a result, the strobe clock input/output circuitry may be enabled or disabled at particular times. As an example, strobe clock signals from the processor to the memory device may be active during a write operation and may be inactive during other operations or when the memory device is not being accessed. When the input strobe clock signals are inactive, components of the input circuitry of the memory device may be disabled. During activation of the strobe clock signals, such as in the initialization of a write cycle, uncertainty in the state of the input circuitry that processes strobe clock signals and/or data inputs in the memory device, may lead to metastability in the logic of the memory device. To prevent metastability from corrupting data, methods employing fixed voltages and/or delays may be used, leading to increased latency in the communication between host and memory device, among other inefficiencies.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems employ random access memory (RAM) devices that may be coupled to processing circuitry (e.g., host), and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the host.

Memory devices may also include command circuitry to receive instructions and/or addresses from the host. For example, in double data rate type five (DDR5) SDRAM devices, these instructions and addresses may be provided by the host via a 14-bit command/address (CA) signal. The coupled host may also provide clocking signals to the memory device along with instructions and/or addresses.

In several RAM devices, such as in DDR5 SDRAM devices, the host may provide a clocking signal Clk through a differential signal pair Clk_t and Clk_c to provide information to the memory device about when an instruction and/or an address signal is ready to be processed. The host may also provide data using a data bus DQ, which may be synchronized with a data strobe signal DQS (e.g., strobe signal, strobe clock signal) that facilitates capture of data in the DQ bus by the memory device. As with the Clk signal, the data strobe signal DQS may also be provided via a differential signal pair DQS_t and DQS_c. Thus, in an example of a write operation, a processor coupled to a DDR5 SDRAM device may provide a CA signal, including the write command and/or address, and may be synchronized with a Clk signal. Following the CA signal that carries the write command, the host may provide data in a data bus DQ which may be synchronized to a data strobe signal DQS to allow proper capture of the data by the DDR5 SDRAM device.

During certain operations (e.g., during a read operation) the memory device does not receive the data strobe signal DQS, as opposed to the Clk signal, which may be continuously provided by the host. In periods in which the memory is not receiving the DQS signal, input circuitry in a memory device responsible for processing the DQS signal may enter an indeterminate state (e.g., metastability). Due to the metastability, flip-flops and/or latches in the circuitry that employs both the Clk signal and the DQS signal for performing a memory operation, such as data input circuitry, may enter an indeterminate or inconsistent state. In order to exit the metastability state, a period employing a fixed signal pattern (e.g., a fixed voltage) may be employed leading to increased delays. Systems and methods described in this application are related to adjustments of delay elements in the data input circuitry and/or the command and address circuitry that allow management of latencies between Clk and DQS signals to reduce metastability. As detailed below, certain methods may employ signal training during initialization (e.g., in a write level initialization mode, or a WL Init mode) to create an intentional phase difference between the Clk and DQS signals, which may increase stability of initialization. Certain methods may manage delay elements to that end. Embodiments, generally, allow a quicker initialization of the memory device by preventing the input circuitry from entering a metastability state and bypassing the recovery time and/or reducing recovery time from a metastable state. While the embodiments described herein are related to memory circuitry, the methods and systems may be employed more generally in input circuitry where metastability may affect the performance.

Figure 1:
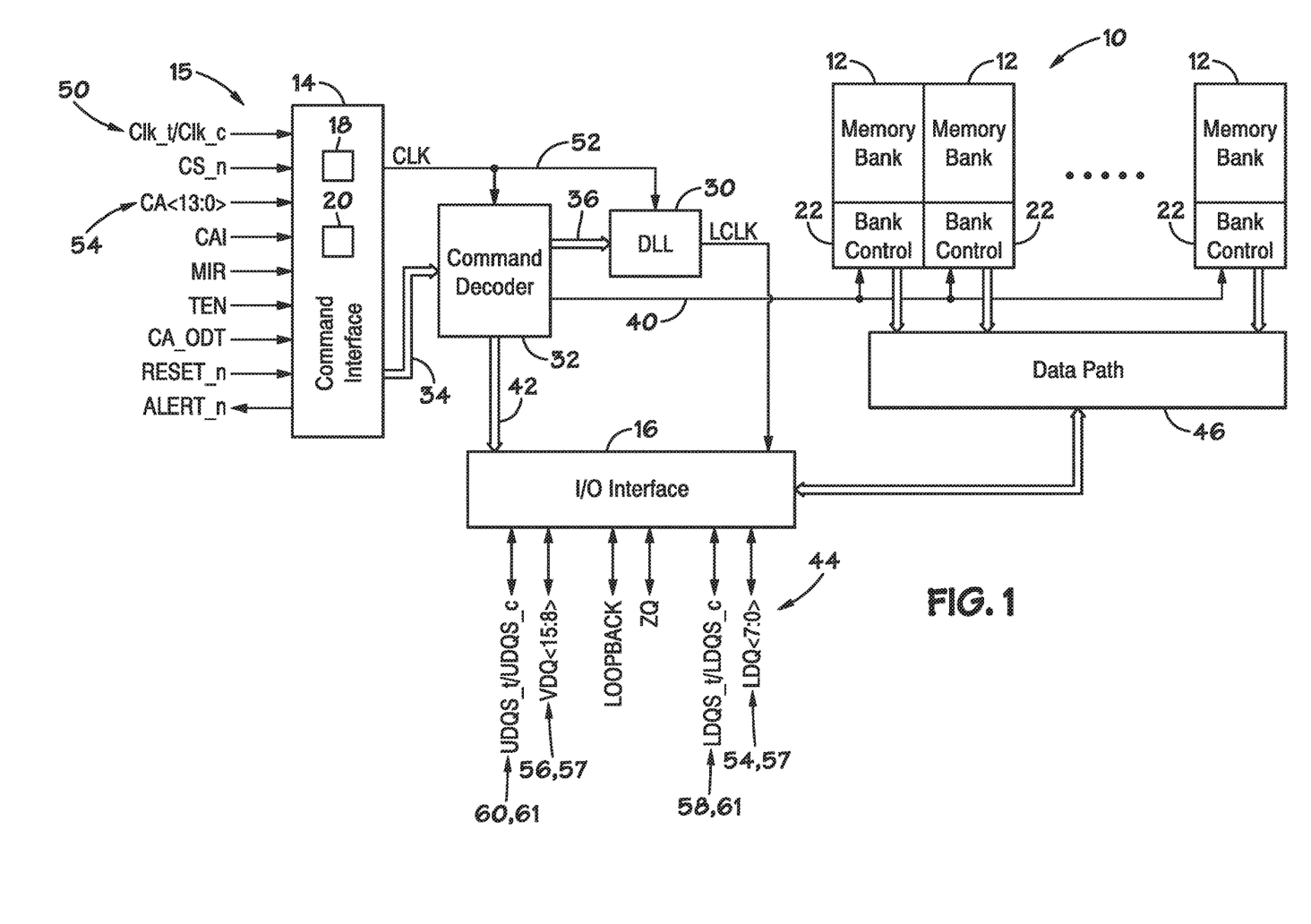
FIG. 1 is a block diagram illustrating an organization of a memory device that may benefit from the use of reduced metastability using signal training, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from an external device or host, such as a processor or controller. The processor or controller may provide various signals 15 to the memory device 10 to facilitate the transmission and receipt of data to be written to or read from the memory device 10. As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals 50, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal 52.

The clock input circuit 18 receives the differential pair of clock signals 50 and generates an internal clock signal CLK 52. The internal clock signal CLK 52 is supplied to an internal clock generator 30, such as a delay locked loop (DLL) circuit. The internal clock generator 30 generates a phase controlled internal clock signal LCLK based on the received internal clock signal CLK 52. The phase controlled internal clock signal LCLK is supplied to the I/O interface 16, for instance, and may be used as a timing signal for determining an output timing of read data or generates a capture window of write data.

The internal clock signal CLK 52 may also be provided to various other components within the memory device 10 and may be used to generate various additional internal clock signals. For instance, the internal clock signal CLK 52 may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK.

The command decoder 32 may also decode commands, such as read commands, right commands, and activate commands and provide instructions to the I/O interface 16 via I/O bus 42 to regulate the flow of data between the data path 46 and the circuitry external to the memory device. Further, the command decoder 32 may, based on the decode commands, provide access to a particular memory bank 12 corresponding to the command and/or address, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and writes commands, based on the command/address signals 54 received from an external device, such as a processor. In one embodiment, the command/address bus may be a 14-bit bus to accommodate the command/address signals 54 (CA<13:0>). The command/address signals 54 are clocked to the command interface 14 using the differential pair of clock signals 50, as discussed above. The command interface may include a command address input circuit 20 which is configured to receive and transmit the commands to provide access to the memory banks 12, through the command decoder 32. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals 54 CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing. The command interface 14 may also be used to provide an alert signal (ALERT_n) to the system processor or controller for certain errors that may be detected. For instance, an alert signal (ALERT_n) may be transmitted from the memory device 10 if a cyclic-redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals 57, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> or upper DQ signal 56, DQ<7:0> or lower DQ signal 55) corresponding to upper and lower bytes of the data signals, for instance.

To allow for higher data rates within the memory device 10, certain memory devices, such as DDR memory devices may utilize data strobe signals, generally referred to as DQS signals 61. As discussed above, the DQS signals 61 are driven by the external processor or controller sending the data (e.g., for a write command) or by the memory device 10 (e.g., for a read command). For read commands, the DQS signals 61 are effectively additional data output (DQ) signals with a predetermined pattern. For write commands, the DQS signals 61 are used as clock signals to capture the corresponding input data. As with the clock signals 50 (Clk_t and Clk_c), the data strobe (DQS) signals 61 may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c 60; LDQS_t and LDQS_c 58) corresponding to upper and lower bytes of data sent to and from the memory device 10, for instance. In the present disclosure, DQ signals 57 such as UDQ signal 56 or LDQ signal 54 may be generally referred to as XDQ signal 57. Similarly, strobing signals such as UDQS signals 60 and LDQS signals 58 may be generally referred to as XDQS signal 61.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16. As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
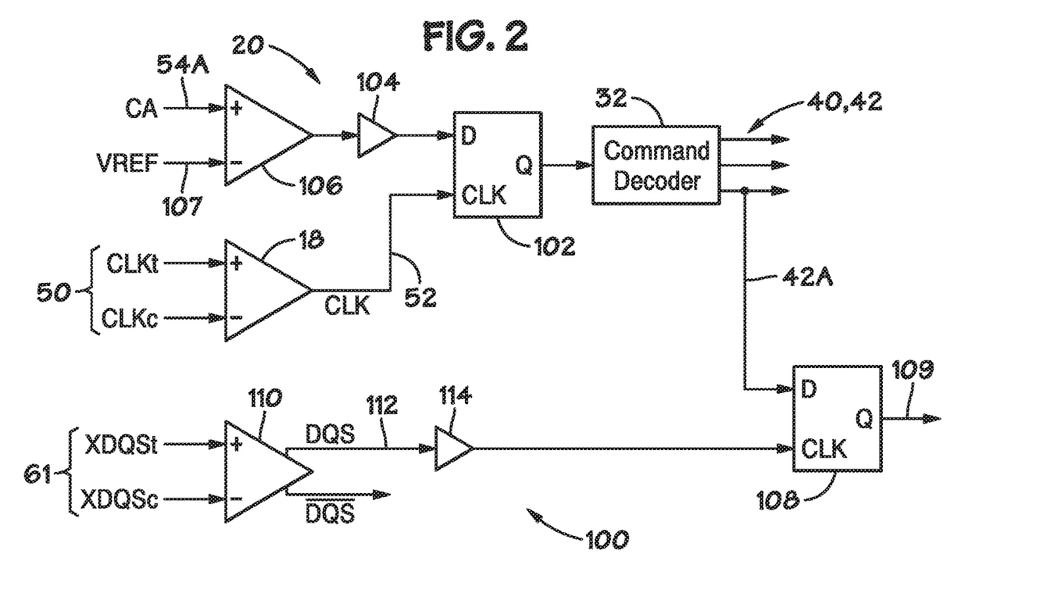
FIG. 2 is a block diagram illustrating a schematic circuit for decoding commands and receiving data and may perform signal training, in accordance with an embodiment.

Schematic block diagram 100 in FIG. 2 illustrates command/address input circuitry 20 of a memory device 10 that may be used to process a write command using clocking signals and data strobe signals. The circuit 20 may receive a CA signal 54A, which may contain a write command, and may generate an internal write control 109 to begin data capture. The internal write control 109 may, for example, initiate a write burst counter, as discussed below. The CA signal 54A may be a portion of the received signal 54 illustrated in FIG. 1 that contains the instructions. For example, in a DDR5 SDRAM device, the CA signal 54A may be the first (e.g., lower) 10 bits of the CA signal 54, which may carry operation instructions from the processor. The CA signal 54A may be clocked by a Clk signal 50, which may be provided as a differential pair. The received CA signal 54A may be stored in an input latch 102 that is clocked by the Clk signal 50. The received CA signal 54A may be processed by an input comparator 106 which compares the CA signal 54A waveform with a reference voltage 107, which may be about halfway between a rail voltage and a ground voltage of the memory device. A delay element may 104 may be placed between the input comparator 106 and the input latch 102. As discussed above, the differential pair Clk signal 50 may be processed by clock input circuitry 18 to produce the CLK signal 52 which may be used internally by the memory device. As the input latch 102 receives the internal CLK signal 52 and CA signal 54A from the input comparator 106, the delay element 104 may be adjusted to match the CA signal 54A and the CLK signal 52 at the input latch 102. The input circuitry 20 may include as many input comparators 106, delay elements 104, and input latches 102 as the number of command bits in the CA signal 54A. In the example of a DDR5 SDRAM, in which the CA signal 54A include 10 command bits, schematic block diagram 100 may include 10 input comparators 106, 10 delay elements 104 and 10 input latches 102, which may be by the CLK signal 52.

The CA signal 54A, stored in input latch 102, may be decoded by a command decoder 32 to produce an instruction signal in bus path 40 and/or I/O bus 42. If the CA signal 54A includes a write command, the command decoder 32 may, among other things, produce a write command 42A to prepare the I/O interface 116 to receive incoming data. As discussed above, the incoming data may be clocked by a clocking data strobe differential pair 61 which may be converted in a comparator circuitry 110 to a data strobe signal 112. A latch 108 may receive the write command 42A and may be clocked by the data strobe signal 112. As a result, the latch 108 may produce the internal write control 109 at a first edge of the data strobe signal 112 which occurs following the production of the write command 42A. In order to adjust the timing to correct for skews between the CLK signal 52 and the data strobe signal 112, a delay element 114 may be used to add a latency to the data strobe signal 112, as discussed below.

Figures 3, 4:
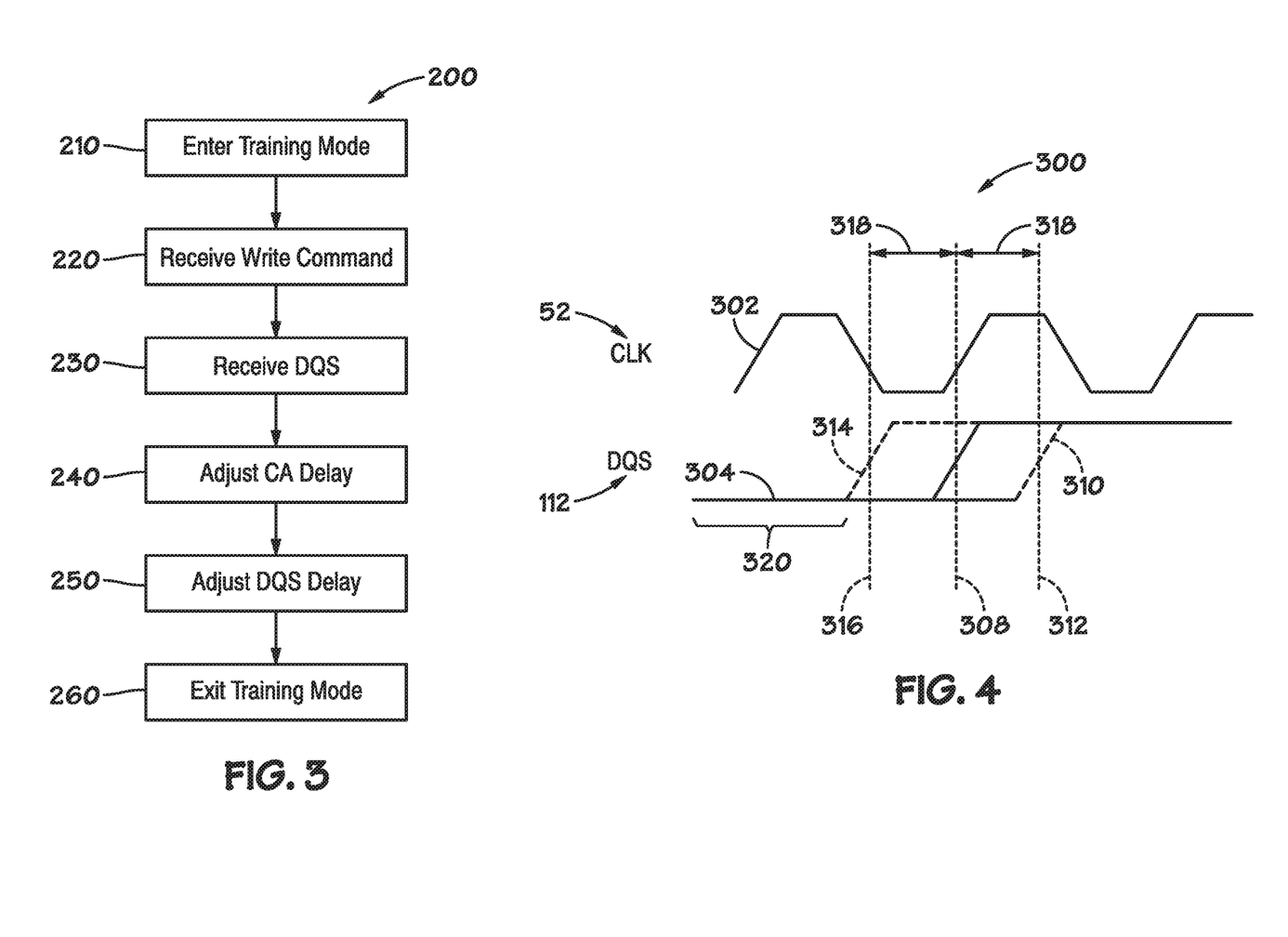
FIG. 3 is a flow chart illustrating a method to adjust delay elements in input circuitry during a training process, in accordance with an embodiment.
FIG. 4 is a chart illustrating phase differences and phase difference tolerances between clock and data strobe signals, in accordance with an embodiment.

The input circuitry 20 described in the schematic block diagram 100 includes delay elements 104 and 114 which may be adjusted. The flow chart in FIG. 3 illustrates a method 200 that may employ signal training to adjust the delay elements. The signal training may be established between the memory device and a host (e.g., a processing circuitry controlling the device) during the beginning of a connection, or after a refresh cycle (e.g., a reset) of the connection to determine a skew between the received CA signal 54 or the clock signal (e.g., CLK signal 50) and the data strobe signal (DQS 112) and provide a feedback to the host. For example, signal training may occur during the write level initialization during a write leveling mode. The host may provide a command to enter in the training mode (box 210) using the CA signal. After entering the training mode, the host may send a dummy write command via the CA signal 54, which may be received by the input circuitry (box 220), such as the input circuitry 100 illustrated in FIG. 2. The memory device 10 may then prepare to receive the data strobe signal from the host (box 230). In the regular training process, the memory device 10 may provide a feedback signal to the host in the data bus (e.g., DQ bus) which may cause the host to advance or delay the data strobe signal provided.

During the training mode, the memory device 10 may adjust delays in the CA signal and/or the data strobe signal by adjusting delay elements 104 and/or 114 respectively. The CA delays may be adjusted by adjusting to match the received CA signal 54A with the received clock signal 52 by adjusting delay element 104 (box 240). The DQS delay may be adjusted by adjustments to the delay element 114 (box 250). Adjustments may cause changes to the timing of the feedback training signal which leads to adjustments of the data transmission clocking in the host. For example, if delay element 114 is adjusted to increase a latency in the DQS signal, the feedback signal will be delayed, causing the host to advance the DQS signal. Conversely, decreasing the DQS latency by adjusting the delay element 114 may lead to a faster feedback signal, causing the host to delay the data strobe signal during training. Adjustments of the delay elements may be also coordinated to improve overall performance of the memory device. Adjustment of the delay element 104 (box 240) may change the latency between the reception of the write command in CA signal 54A and the production of the internal write command 42A and thus, may influence the feedback data signal. Therefore, in boxes 240 and 250, the memory device may adjust the delay elements 104 and 114 to adjust the skews between the received write command and the received data strobe signals to reduce the time to create internal signal 109, which reduces the latency during write commands. As the host and the memory devices are in the training mode, the host device will adjust the skews accordingly based on the received feedback signal. Once the skews are adjusted, the host and the memory may exit training mode via a CA signal (box 260).

The timing diagram 300 in FIG. 4 illustrates the clocking signals that may be received by a memory device 10 during the initialization of a write burst, following a write command. The timing diagram 300 illustrates tolerances between the clock signal 52 and the data strobe 112, which may be defined in standards such as the DDR5 standards. Curve 302 may correspond to a received clock signal 52 and curve 304 may correspond to a received data strobe 112 during the beginning of the write cycle. The first edge in the curve 304 may be measured relative to the rising edge of the clock signal in curve 302 at time 308. The memory device 10 may receive the first rising edge of the data strobe 112 as late as at time 312 (e.g., edge 310) or as early as at time 316 (e.g., edge 314). The allowable range of skews may be described as a tolerance margin, tDQSS 318. Thus, the delay elements adjusted as described in method 200 above may be used to satisfy the tolerance margin tDQSS 318.

The timing diagram 300 also illustrates a write leveling initialization (WL Init) period 320 prior to the first edge at the beginning of the write cycle. As discussed above, prior to receiving the write command, the data strobe 112 received by the memory device 10 may be undriven or undefined. Following the reception of the CA signal containing the write command, the host may drive the data strobe line 112 to a low level (e.g., a fixed level) during the WL Init period 320. The WL Init period 320 may last for a fixed number of cycles. The duration of the WL Init period 320 may allow for the input circuitry to stabilize and exit the metastable state. For example, during the WL Init period 320, flip-flops in a counting circuitry, such as the one illustrated in FIG. 8C, may be reset. It should be noted that the WL Init period 320 may lead to an increase in the latency in the generation of the internal write control 109 from the receiving the CA signal 54A. Such latency may add to the latencies caused by the delay element 114 in the data strobe signal, adjusted to match the latency to produce the write command 42A in latch 108.

Figure 5:
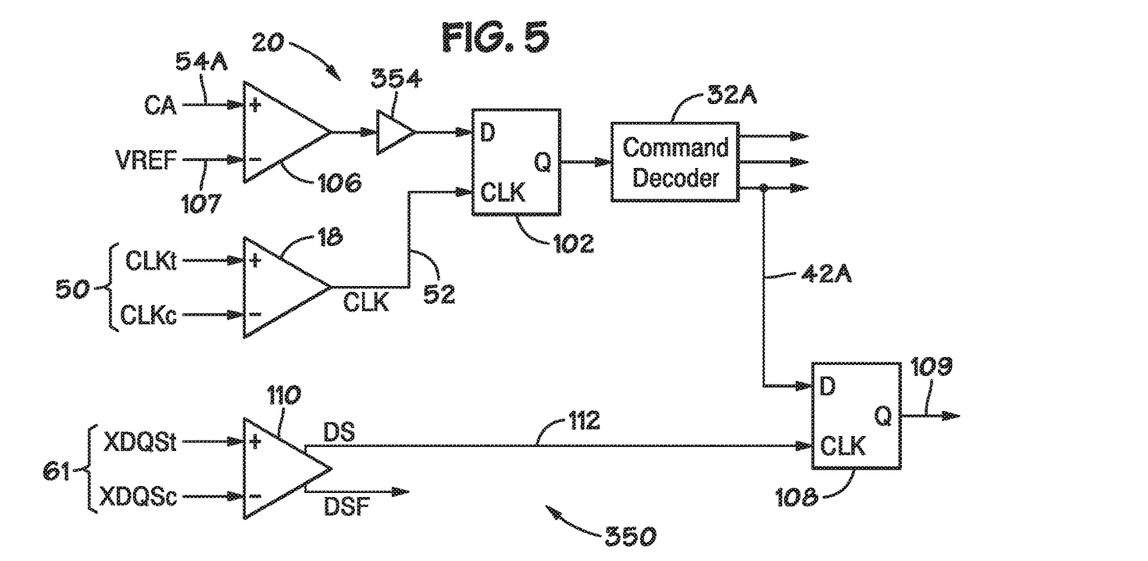
FIG. 5 is a block diagram illustrating a schematic circuit for decoding commands and receiving data that may employ a single delay element, in accordance with an embodiment.

Schematic block diagram 350 in FIG. 5 shows input circuitry of a memory device 10 that may be used to process write commands without the use of a delay element in the data strobe path. The circuit may receive a CA signal 54A, which may contain a write command, and may generate an internal write control 109 to begin data capture, without using a delay element in the data strobe path, reducing the latency between the received data strobe clock and the generation of the internal write control 109. As discussed above, the CA signal 54A may be a portion of the received signal 54 illustrated in FIG. 1. In a DDR5 SDRAM device, the CA signal 54A may be the first (e.g., lower) 10 bits of the CA signal 54. The circuit may also receive a Clk signal 50 which may be provided as a differential pair. The received CA signal 54A may be stored in an input latch 102 that is clocked by the Clk signal 50. The received CA signal 54A may be processed by an input comparator 106 which compares the CA signal 54A waveform with the reference voltage 107. A delay element 354 may be placed between the input comparator 106 and the input latch 102. As discussed above, the differential pair Clk signal 50 may be processed by clock input circuitry 18 to produce the CLK signal 52. As the input comparator 106 receives CLK signal 52 and CA signal from the input comparator 106, the delay element 354 may be adjusted to match the latencies in the CA signal 54A path and in the CLK signal 52 path. The input circuitry may include as many input comparators 106, delay elements 354, and input latches 102 as the number of bits in the CA signal 54A.

During the training process, the command decoder 32A may provide a feedback signal to the host earlier than the received data strobe signal 61. As discussed above, this will cause the host to delay the provision of the data strobe signal and/or the data during write operations. Accordingly, during the write operations, the write command CA signal 54A stored in input latch 102 and decoded by a command decoder 32A to produce the write command 42A, may arrive at the latch 108 at the same time as the data strobe signal 112, without addition of delay in the data strobe path. Thus, the write command 42A from the command decoder 32A may be provided earlier during training and normally during the operation, and the data strobe may be provided later due to the signal training, as discussed above. The latch 108 may, as a result, receive the write command 42A prior to the first edge of the data strobe 112 with no need for delaying the data strobe signal, which results in a correctly generated internal write control 109 that matches the beginning of the write data burst with a lower write latency.

Latches and flip-flops that receive signals from the undriven data strobe line may enter an unknown state (e.g., metastability) prior to the write burst, as discussed above. Therefore, latch 108 itself may be subject to metastability as it is coupled to data strobe input 112. The input circuitry illustrated by the schematic block diagram 380 in FIG. 6 may be used to prevent the unknown states from causing metastability in the beginning of a write burst by employing a gate in place of a flip-flop. As illustrated, the circuit may receive a CA signal 54A, and may generate an internal write control 109 to begin data capture using a logic gate that always provides a valid signal, preventing metastability from propagating in the input circuitry.

Figure 6:
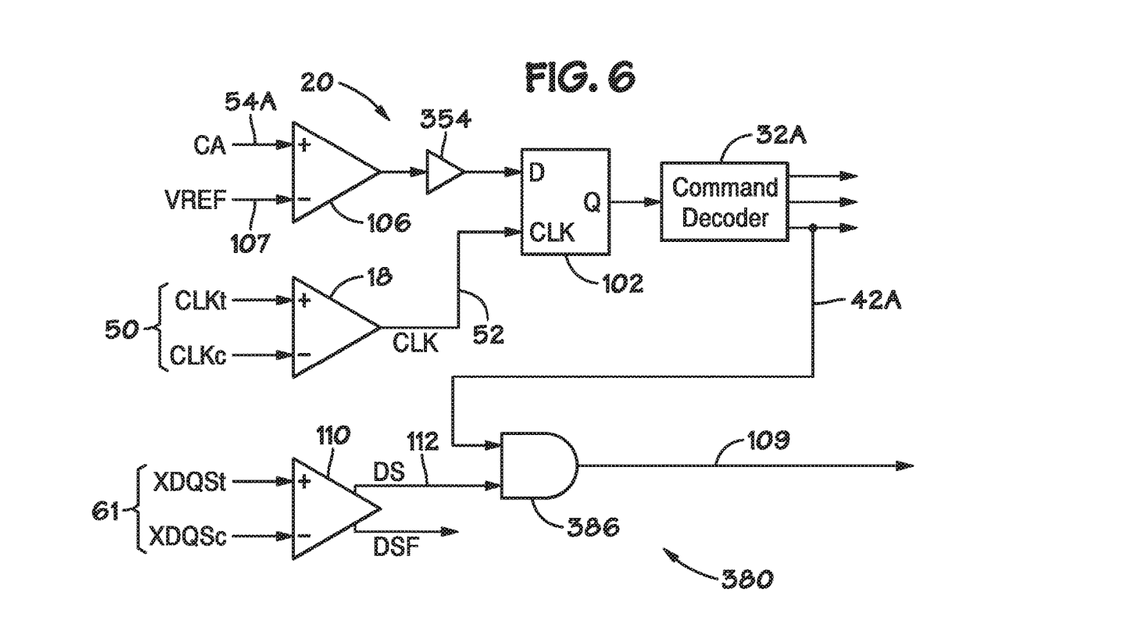
FIG. 6 is a block diagram illustrating a schematic circuit for decoding commands and receiving data that may employ data strobe signal gating, in accordance with an embodiment.

The CA signal 54A may be a portion of the received signal 54 illustrated in FIG. 1. In a DDR5 SDRAM device, the CA signal 54A may be the first (e.g., lower) 10 bits of the CA signal 54. The CA signal may be matched to a Clk signal 50, which may be provided as a differential pair. The received CA signal 54A may be stored in an input latch 102 that is clocked by the Clk signal 50, as discussed above. The received CA signal 54A may be processed by an input comparator 106 which compares the CA signal 54A waveform with the reference voltage 107. A delay element 354 may be placed between the input comparator 106 and the input latch 102. As discussed above, the differential pair Clk signal 50 may be processed by clock input circuitry 18 to produce the CLK signal 52. As the input comparator 106 receives CLK signal 52 and CA signal from the input comparator 106, the delay element 354 may be adjusted to match the CA signal and the CLK signal 52. The input circuitry may include as many input comparators 106, delay elements 354, and input latches 102 as the number of bits in the CA signal 54A.

As discussed above, the use of a gate that provides a valid input to the input circuitry may prevent flip-flops of the input circuitry from entering metastability. For example, the write command 42A will hold the output of the gate 386 to a low logic value (e.g., FALSE or zero) when the differential pair 61 is undriven instead of an indeterminate signal, preventing circuitry that receives the internal write command 109 from entering metastability. As a result, the WL Init period 320 discussed above may be shortened without causing metastability from affecting data storage during initialization of the write burst. Thus, in the circuitry illustrated by block diagram 380, the command decoder 32A may produce a feedback signal that is delayed during training, causing the host device to provide an earlier data strobe signal 61. As a result, during regular operation, the write command CA signal 54A, stored in input latch 102 and decoded by a command decoder 32A to produce the write command 42A, may arrive at gate 386 during the WL Init period 320. The gate 386 (e.g., an AND gate) may be employed to gate the data strobe 112 based on the write command 42A to generate the internal write command 109.

Figure 7:
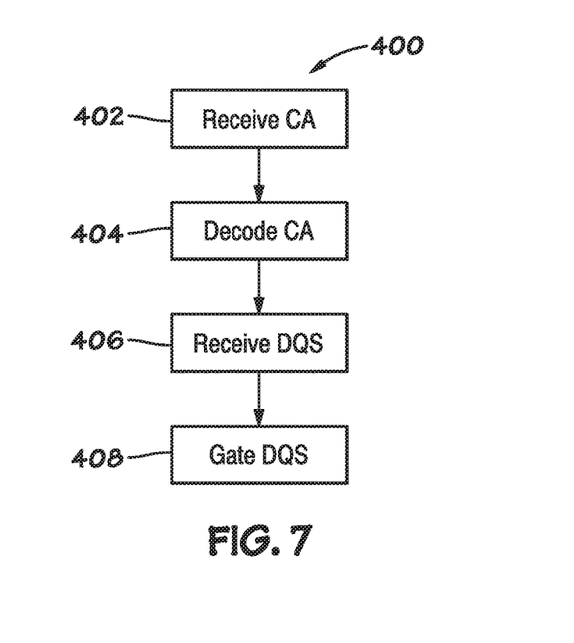
FIG. 7 is a flow chart illustrating a method to perform gating of data strobe signals using a trained signal, in accordance with an embodiment.

The flow chart in FIG. 7 illustrates a method 400 to prevent metastability in input circuitry 18 of a memory device 10 from impacting write operations. The method 400 may be employed during a write operation in which a host device coupled to the memory device 10 provides a write command (e.g., a CA command 54A) matched to a clocking signal and, following a specified period (e.g., WL Init period 320) provides data matched to a data strobe signal. The memory device 10 may receive the write command in a CA signal (box 402). The memory device 10 may decode the CA signal and enable control lines, including a write command, that instruct the input circuitry to receive data matched by the data strobe signal (box 404). The memory device 10 may begin receiving the data strobe signal (box 406), which may have a WL Init period 320. The input circuitry 18 of the memory device 10 may gate the data strobe signal based on the write command generated (box 408) during the WL Init period. The use of a gate in place of a latch to process the signal may lead to preventing metastability from propagating into the latches, as discussed above.

Figure 8A:
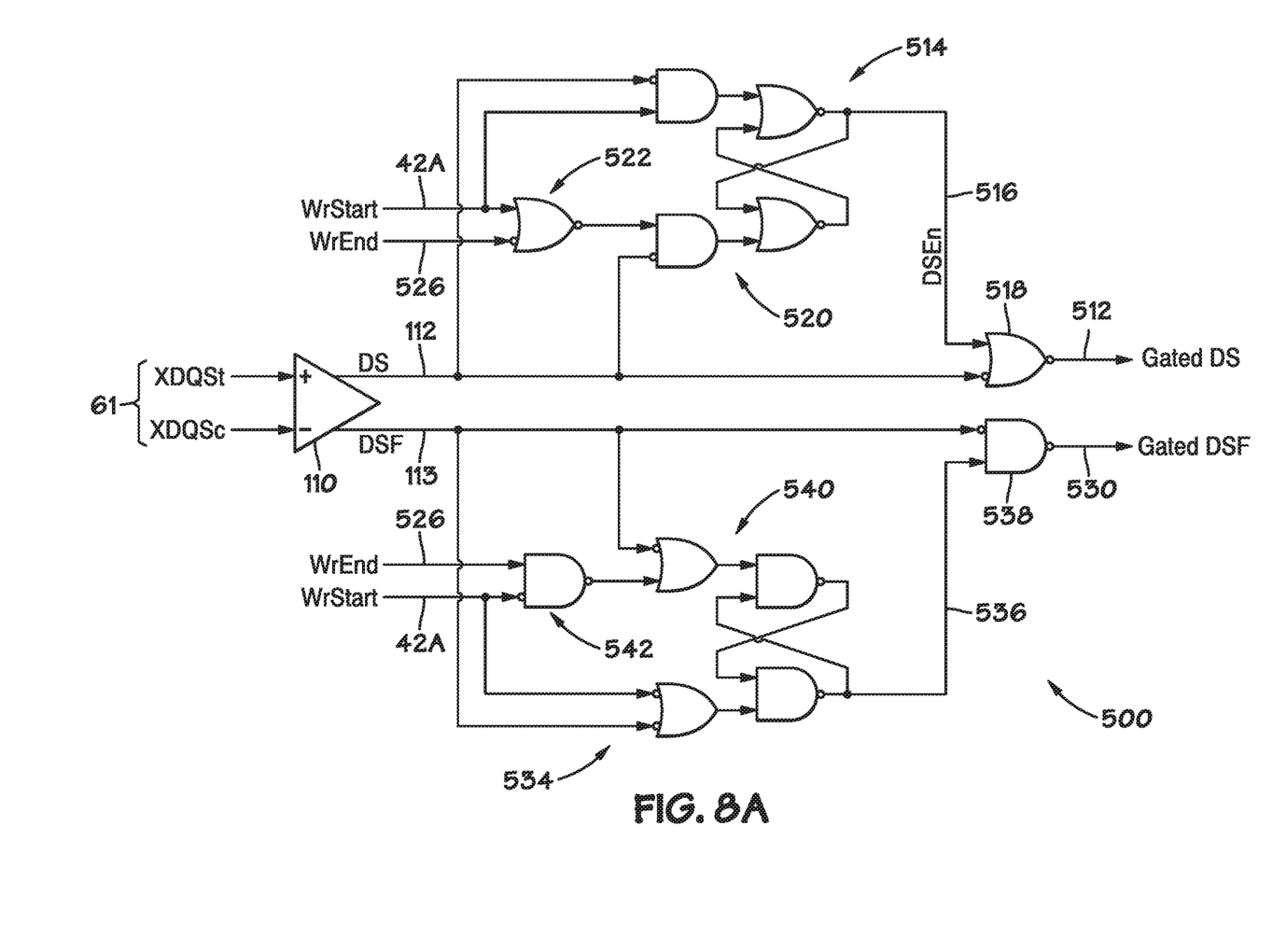
FIG. 8A is a first part of a block diagram illustrating a schematic circuit for generating instructions for write bursts using data strobe signal gating, in accordance with an embodiment.
Figure 8B:
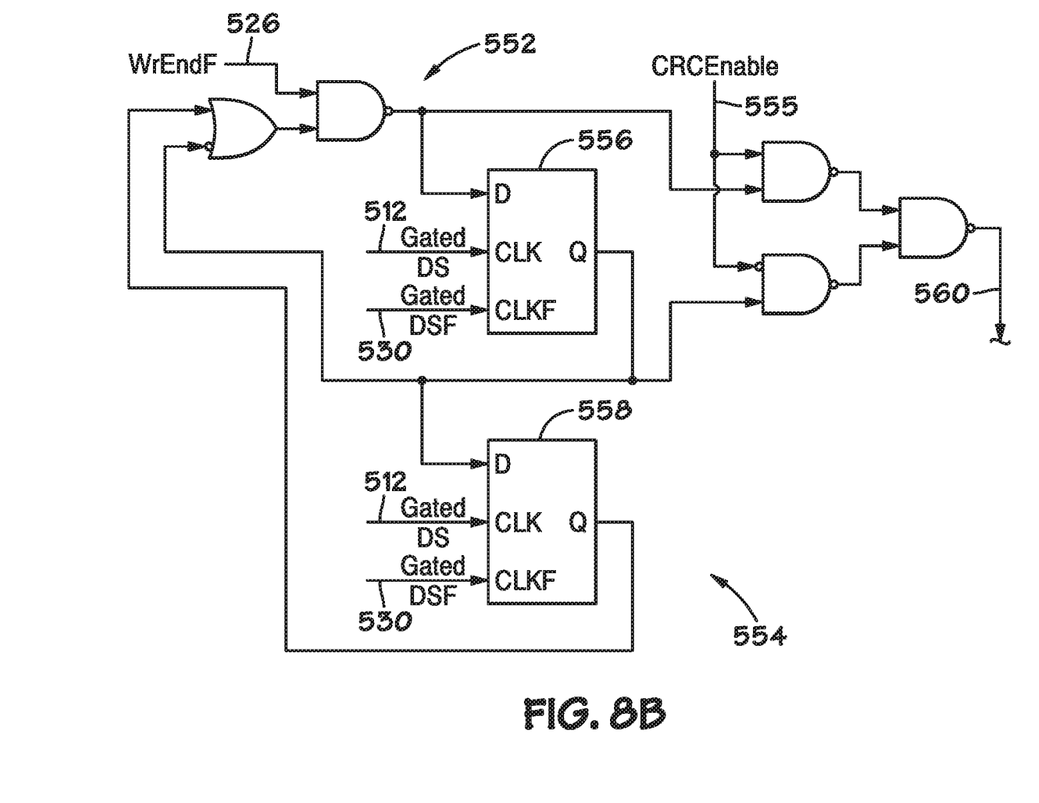
FIG. 8B is a second part of the block diagram illustrating the schematic circuit for generating instructions for write bursts using data strobe signal gating, in accordance with an embodiment.
Figure 8C:
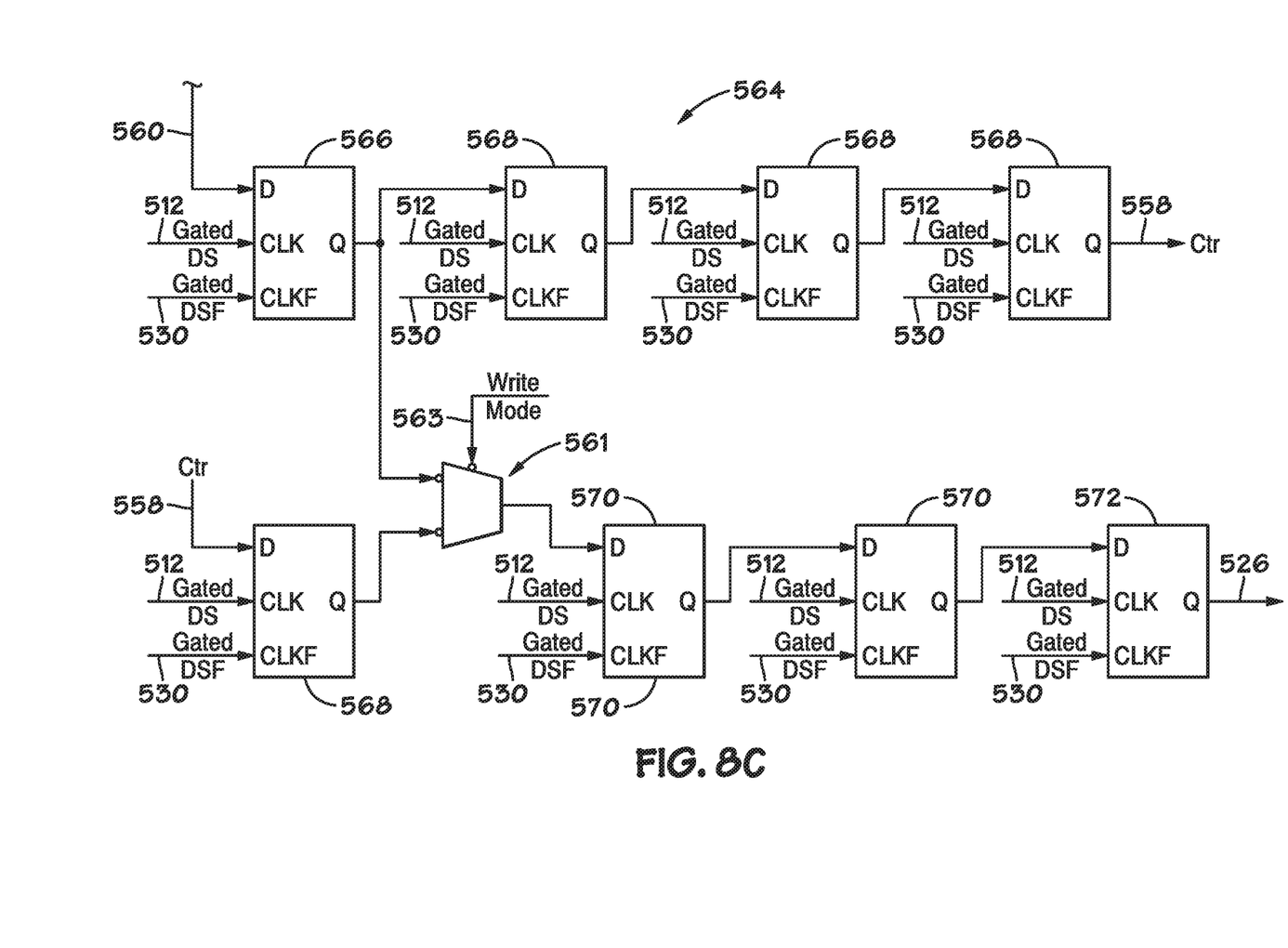
FIG. 8C is a third part of the block diagram illustrating the schematic circuit for generating instructions for write bursts using data strobe signal gating, in accordance with an embodiment.

The schematic block diagrams in FIGS. 8A, 8B, and 8C illustrate an implementation of an input circuitry 18 that may be used to process a write operation. The input circuitry 18 formed by block diagrams 500, 554, and 564 may receive a write command signal 42A and a data strobe pair 61, may count a number of data strobe cycles and may, at the end of the counting, issue a write end command 526 which may halt the data acquisition by the memory device 10. The block diagram 500 in FIG. 8A illustrates a first stage of the circuitry 18. The differential pair of data strobe signals 61 may be processed by a comparator 110 to produce a data strobe signal 112 and a data strobe complement 113.

A latch circuitry 514 may process an incoming write command 42A which may be enabled at the start of a writing burst. The latch circuitry 514 may receive the write command 42A and clock it based on the data strobe signal 112 to produce a gating enable signal 516. The gating enable signal 516 may be used to gate the data strobe signal 112 in a gate 518 (e.g., NOR gate) to produce the gated data strobe signal 512. The latch circuitry 514 may include a latch 520 that is clocked by the data strobe signal 112. The input of the latch circuitry 514 may include a logic 522 which may combine the write command 42A and the write end command 526 to allow initiation of operations at the beginning of the write cycle and interruption of operations at the end of the write cycle.

Similarly, the latch circuitry 534 may process the incoming write command 42A and clock it based on the data strobe complement 113 to produce a second gating enable signal 536. The gating enable signal 536 may be used to gate data strobe complement 113 in a gate 538 (e.g., a NAND gate) to produce the gated data strobe complement 530. The latch circuitry 534 may include the latch 540 that is clocked by the data strobe complement 113. The input of latch circuitry 534 may include a logic 542 which may combine the write command 42A and the write end command 526 which may allow initialization and/or interruption of the write cycle.

It should be noted that the first stage of the circuitry may provide a protected gated data strobe signal 512 and gated data strobe complement 530. The presence of latch circuitry 514 provides a gating enable signal 516 to the NOR gate 518 that is only low (e.g., zero) when the write command 42A is high, the write end command 526 is low, and the data strobe signal 112 is stable, as discussed above. Similarly, the latch circuitry 516 provides a second gating enable signal 536 to the NAND gate 518 that is only high (e.g., one) when the write command 42A is high, the write end command 526 is low, and the data strobe complement 113 is stable. This protection prevents an unstable data strobe signal 112 and/or an unstable data strobe complement 113 from causing metastability in the flip-flops that form the remainder of the circuitry, illustrated in FIGS. 8B and 8C.

The block diagram 554 in FIG. 8B illustrates a second stage of the circuitry. The second stage receives the gated data strobe 512 and data strobe complement 530 created by the first stage illustrated in FIG. 5A. A reset stage 552 may have gating circuitry for creating a reset signal for the counter. The reset stage 552 may receive a write end command 526 that may reset the flip-flops in the counter stage 564 illustrated in FIG. 8C, which may reset the counters. A cyclic-redundancy check (CRC) stage 554 may receive a CRC enable signal 555, which may cause the circuitry to choose a mode of operation. In a first mode of operation, the gated data strobe signals 512 and complement 530 may be processed by a single latch 556, while in a second mode of operation latch 556 is bypassed in order to skip one count cycle. The feedback arrangement between latches 556 and 558 may be used to limit the pulse width of the output signal to 2 cycles, even if the input signal is wider (e.g., write end command 526 is held for more than 2 clock cycles). The CRC stage 554 may provide as output a signal 560 that may be enabled during a write burst and disabled when the memory device 10 is not receiving any data, or receives invalid data as indicated by the CRC enable signal 555.

The counter stage 564 may have a cascade of flip-flops 566, 568, 570, and 572 which may be arranged as a shift register to count the number of data strobe cycles while the signal 560 is enabled as illustrated in FIG. 8C. When the counter stage 564 overflows (i.e., the last flip-flop 572 of the counter resets), the counter stage 564 may generate a write end command 526. It should be noted that the size of the shift register in the counter stage 564 may be configured by the multiplexer 561 to adjust the number of bits written (e.g., the number of data strobe cycles counted). Multiplexer 561 may receive a write mode signal 563 to adjust the number of flip-flops in the shift register. For example, in a first mode the multiplexer may be configured such that the shift register includes flip-flops 556, the 4 flip-flops 568, flip-flops 570 and flip-flop 572, resulting in a 8 cycle counter, which may correspond to 16 bits of data in a DDR protocol. In a second mode, the multiplexer may be configured to bypass the 4 flip-flops 568 and couple the output of flip-flop 566 to flip-flops 570. In this configuration, the counter stage 564 becomes a 4 cycle counter, which may correspond to 8 bits of data in a DDR protocol. As a result, the example circuits 554 and 564 may be configured to count 8 or 16 bits without CRC bits or 10 or 16 bits when combined with the CRC enable bits discussed above with respect to circuit 564.

Embodiments of the methods and systems described herein may be used to increase the reliability and decrease latencies in the response of electronic devices (e.g., memory devices) coupled to a host, in which the device's input circuitry may be subject to metastability effects. Certain methods may also employ adjustments to delays during a signal training stage to cause adjustments to the host. Systems described herein may employ logic that provides a valid input from an undriven input, which prevents the input circuitry from entering the metastability state. The embodiments may employ signal training methods to cause a host to advance and/or delay a particular signal in view of the adjustment of the input circuitry to metastability. As a result of the implementation of the methods and systems, the initialization of processes (e.g., a write burst) between the electronic device and the host may present reduced latency without data corruption.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device comprising:
a delay element configured to receive a command signal;
a latch configured to receive the command signal from the delay element and to output the command signal based on a clock signal, wherein the delay element is configured to match a latency of the command signal to a latency of the clock signal;
a command decoder configured to receive the command signal, wherein the command decoder is configured to provide a write command signal when the received command signal comprises a write operation; and
circuitry configured to receive the write command signal and a data strobe signal, and to output an internal write control signal.

2. The memory device of claim 1, wherein the circuitry comprises a latch.

3. The memory device of claim 1, wherein the circuitry comprises a gate.

4. The memory device of claim 3, wherein the gate comprises an AND gate.

5. The memory device of claim 1, comprising:
a strobe comparator configured to receive a differential strobe signal and to provide the data strobe signal to the circuitry.

6. The memory device of claim 1, comprising:
a second delay element configured to provide that data strobe signal to the circuitry.

7. The memory device of claim 1, comprising:
a clock comparator configured to receive a differential clock signal and to provide the clock signal to the latch.

8. The memory device of claim 1, comprising counter circuitry configured to receive the write command signal and the internal write control signal, and to provide a write end command signal.

9. The memory device of claim 1, wherein the data strobe signal comprises a double-data rate data strobe signal.

10. The memory device of claim 1, wherein the memory device comprises a DDR5 SDRAM memory device.

11. A memory device comprising:
a command decoder configured to receive a command and address signal and to provide a write command;
circuitry configured to receive a data strobe signal and the write command, and to provide a gated data strobe signal, wherein the gated data strobe signal comprises a fixed voltage signal when the data strobe signal is not driven; and
counting circuitry configured to receive the gated data strobe signal and to provide a write end command to the circuitry.

12. The memory device of claim 11, wherein the command and address signal is configured to cause the memory device to operate in a signal training mode that causes a host device, external to the memory device, to advance a transmission of the data strobe signal.

13. The memory device of claim 12, comprising a first delay element configured to delay the received command and address signal while the memory device operates in the signal training mode.

14. The memory device of claim 11, wherein the counting circuitry comprises a 4-bit mode and a 8-bit mode.

15. The memory device of claim 11, wherein the counting circuitry comprises a plurality of flip-flops arranged in a cascade.

16. The memory device of claim 11, comprising a cyclic-redundancy check (CRC) circuitry.

17. The memory device of claim 11, wherein the circuitry comprises:
latch circuitry that receives the data strobe signal, the write command, and the write end command, and provides a gate enable signal; and
a gate configured to receive the data strobe signal and the gate enable signal, and to provide the gated data strobe signal.

18. The memory device of claim 11, wherein the memory device comprises a DDR5 SDRAM device.

19. A method to prevent metastability in a memory device, comprising:
performing a signal training routine, the method comprising:
receiving an instruction signal comprising a write operation from a host device;
decoding the write operation to create a write command in a decoder of the memory device;
receiving a data strobe signal from the host device; and
advancing a feedback of the training routine to the host device in response to the data strobe signal to cause the host device to delay the data strobe signal.

20. The method of claim 19, further comprising:
receiving data from the host device during a write instruction, the method comprising:
receiving a second instruction signal comprising the write operation from the host device;
decoding the write operation to create a write command in the decoder;
during a initialization period of the write operation, providing the write command to gating circuitry configured to receive the data strobe signal; and
gating, in the gating circuitry, the received data strobe signal based using the write command.

21. The method of claim 19, wherein the memory device comprises a DDR5 SDRAM device, and wherein the initialization period comprises a write leveling initialization period.

22. The method of claim 19, comprising during the signal routine, adjusting a delay element configured to delay the instruction signal based on a skew between the instruction signal and a clock signal received in the memory device.

* * * * *